(12) United States Patent
Dolechek et al.

(10) Patent No.: US 7,898,089 B2
(45) Date of Patent: Mar. 1, 2011

(54) SEMICONDUCTOR WORKPIECE

(75) Inventors: Kert L. Dolechek, Kalispell, MT (US); Raymon F. Thompson, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 790 days.

(21) Appl. No.: 11/977,909

(22) Filed: Oct. 26, 2007

(65) Prior Publication Data
US 2008/0063853 A1    Mar. 13, 2008

Related U.S. Application Data

(62) Division of application No. 10/923,363, filed on Aug. 20, 2004, now Pat. No. 7,288,489.

(51) Int. Cl.
*H01L 29/40*    (2006.01)
*H01L 21/461*    (2006.01)

(52) U.S. Cl. ........................... 257/776; 438/745

(58) Field of Classification Search ......... 257/640–649, 257/753, 776, E21.221, E21.223; 438/459, 438/745; 252/79.1–79.5
See application file for complete search history.

(56) References Cited

U.S. PATENT DOCUMENTS 6,712,673 B2 *    3/2004    Albrecht et al. ............... 451/41
6,940,181 B2 *    9/2005    Derderian et al. ............ 257/787
7,288,489 B2 *    10/2007    Dolechek et al. ............ 438/745

* cited by examiner

*Primary Examiner*—Calvin Lee
(74) *Attorney, Agent, or Firm*—Jeffrey A. Gargano; McDermott, Will & Emery LLP (57) ABSTRACT

The present invention provides an apparatus and method for use in processing semiconductor workpieces. The new apparatus and method allows for the production of thinner workpieces that at the same time remain strong. Particularly, a chuck is provided that includes a body, a retainer removeably attached to the body and a seal forming member. When a workpiece is placed on the chuck body and the retainer is engaged to the body, a peripheral portion of the back side of the workpiece is covered by the retainer while an interior region of the back side of the workpiece is exposed. The exposed back side of the workpiece is then subjected to a wet chemical etching process to thin the workpiece and form a relatively thick rim comprised of semiconductor material at the periphery of the workpiece. The thick rim or hoop imparts strength to the otherwise fragile, thinned semiconductor workpiece. Semiconductor workpieces made according to the present invention offer an improved structure for handling thinned wafers in conventional automated equipment. This results in improved yields and improved process efficiency.

21 Claims, 12 Drawing Sheets

SEMICONDUCTOR WORKPIECE

CROSS REFERENCE TO RELATED APPLICATIONS

The present application is a Divisional Application of U.S. patent application Ser. No. 10/923,363, filed Aug. 20, 2004, now U.S. Pat. No. 7,288,489.

TECHNICAL FIELD

The invention relates to a process and apparatus for use with workpieces, such as semiconductor wafers, flat panel displays, rigid disk or optical media, thin film heads or other workpieces formed from a substrate on which microelectronic circuits, data storage elements or layers, or micromechanical elements may be formed. These and similar articles are collectively referred to herein as a "wafer" or "workpiece." Specifically, the present invention relates to a process and apparatus for use in thinning semiconductor workpieces.

BACKGROUND OF THE INVENTION

State of the art electronics (e.g., cellular phones, personal digital assistants, and smart cards) demand thinner integrated circuit devices ("ICD"). In addition, advanced packaging of semiconductor devices (e.g., stacked dies or "flip-chips") provide dimensional packaging constraints which also require an ultra-thin die. Moreover, as operating speeds of ICDs continue to increase heat dissipation becomes increasingly important. This is in large part due to the fact that ICDs operated at extremely high speeds tend to generate large amounts of heat. That heat must be removed from the ICD to prevent device failure due to heat stress and to prevent degradation of the frequency response due to a decrease in carrier mobility. One way to enhance thermal transfer away from the ICD, thereby mitigating any deleterious temperature effects, is by thinning the semiconductor wafer from which the ICD is fabricated. Other reasons for thinning the semiconductor wafer include: optimization of signal transmission characteristics; formation of via holes in the die; and minimization of the effects of thermal coefficient of expansion between an individual semiconductor device and a package.

Semiconductor wafer thinning techniques have been developed in response to this ever increasing demand for smaller, higher performance ICDs. Typically, semiconductor devices are thinned while the devices are in wafer form. Wafer thicknesses vary depending on the size of the wafer. For example, the thickness of a 150 mm diameter silicon semiconductor wafer is approximately 650 microns, while wafers having a diameter of 200 or 300 mm are approximately 725 microns thick. Mechanical grinding of the back side of a semiconductor is one standard method of thinning wafers. Such thinning is referred to as "back grinding." Generally, the back grinding process employs methods to protect the front side or device side of the semiconductor wafer. Conventional methods of protection of the device side of the semiconductor wafer include application of a protective tape or a photoresist layer to the device side of the wafer. The back side of the wafer is then ground until the wafer reaches a desired thickness.

However, conventional back grinding processes have drawbacks. Mechanical grinding induces stress in the surface and edge of the wafer, including micro-cracks and edge chipping. This induced wafer stress can lead to performance degradation and wafer breakage resulting in low yield. In addition, there is a limit to how much a semiconductor wafer can be thinned using a back grinding process. For example, semiconductor wafers having a standard thickness (as mentioned above) can generally be thinned to a range of approximately 250-150 microns.

Accordingly, it is common to apply a wet chemical etch process to a semiconductor wafer after it has been thinned by back grinding. This process is commonly referred to as stress relief etching, chemical thinning, chemical etching, or chemical polishing. The aforementioned process relieves the induced stress in the wafer, removes grind marks from the back side of the wafer and results in a relatively uniform wafer thickness. Additionally, chemical etching after back grinding thins the semiconductor wafer beyond conventional back grinding capabilities. For example, utilizing a wet chemical etch process after back grinding allows standard 200 and 300 mm semiconductor wafers to be thinned to 100 microns or less. Wet chemical etching typically includes exposing the back side of the wafer to an oxidizing/reducing agent (e.g., HF, $HNO_3$, $H_3PO_4$, $H_2SO_4$) or alternatively to a caustic solution (e.g., KOH, NaOH, $H_2O_2$). Examples of wet chemical etching processes may be found in co-pending U.S. patent application Ser. No. 10/631,376, filed on Jul. 30, 2003, and assigned to the assignee of the present invention. The teachings of application Ser. No. 10/631,376 are incorporated herein by reference.

Although methods for thinning semiconductor wafers are known, they are not without limitations. For example, mounting a semiconductor wafer to a submount or "chuck" (as it is commonly known) so that the wafer can be thinned requires expensive coating and bonding equipment and materials, increased processing time, and the potential for introducing contaminates into the process area. Additionally, adhesives for bonding a wafer to a chuck that may be useful in a mechanical grinding process will not withstand the chemical process fluids used in wet chemical etching. Furthermore, the current use of a photoresist or adhesive tape fails to provide mechanical support for very thin wafers either during the back grind process or in subsequent handling and processing. The use of tape also creates obstacles in the removal process. For example, tape removal may subject a wafer to unwanted bending stresses. In the case of a photoresist, the material is washed off the device side of a wafer with a solvent, adding to the processing time and use of chemicals, and increasing the risk of contamination. The use of taping and protective polymers are also costly, since both equipment and materials are necessary to apply and remove the protective media.

Further, thinned semiconductor wafers are prone to warping and bowing. And because thinned semiconductor wafers can be extremely brittle, they are also prone to breakage when handled during further processing. Thinned semiconductor wafers (e.g., below 250 microns) also present complications in automated wafer handling because, in general, existing handling equipment has been designed to accommodate standard wafer thicknesses (e.g., 650 microns for 150 mm wafer and 725 microns for 200 and 300 mm wafers).

Accordingly there is a need for a process and equipment for producing thinner semiconductor workpieces. At the same time, there is a need to provide thinner workpieces that are strong enough to minimize the risk of breakage, yet remain compatible with conventional automated semiconductor wafer handling equipment. Finally, it would be advantageous to develop a system that reduces the number of processing steps for thinning a semiconductor workpiece.

SUMMARY OF THE INVENTION

The present invention provides a method and apparatus for use in processing semiconductor wafers. The new system and apparatus allows for the production of thinner wafers that at the same time remain strong and resistant to bowing and warping. As a result, the wafers produced by the present process are less susceptible to breakage. The process and equipment of the present invention also offers an improved product structure for handling thinned wafers, while reducing the number of processing steps. This results in, among other things, improved yields and improved process efficiency.

In one aspect, the present invention provides a chuck for receiving and supporting a semiconductor workpiece having a device side, a bevel and a back side. The chuck has a body for supporting the workpiece, a retainer removeably attached to the body and adapted to cover a peripheral portion of the back side of the workpiece, and at least one member for creating a seal between the retainer and the back side of the workpiece. Due to its configuration, the chuck permits an interior region of the back side of the workpiece to be exposed, while protecting the peripheral portion of the back side of the workpiece. The workpiece is then thinned via a wet etching process. The result is a processed semiconductor workpiece that has a thinned main body (e.g., less than approximately 125 microns) and a thick rim (e.g., in a range of approximately 600 to 725 microns). The relatively thicker rim provides strength to the thinned workpiece and permits the workpiece to be handled for additional processing with conventional automated handling equipment.

In another aspect, the present invention provides a semiconductor workpiece having a main body and a rim comprised of semiconductor material. The main body is integrally connected to the rim and has a thickness less than approximately 50% of the rim thickness. The relatively thick rim provides strength to the workpiece, preventing the main body from bowing and warping. Meanwhile, the main body of the semiconductor workpiece can be thinned to a thickness less than 300 microns, preferably less than 125 microns, more preferably less than 100 microns, especially less than 50 microns and even less than 25 microns. The structural configuration of thinned semiconductor workpieces of the present invention meet the industry demand for thinned ICDs necessary in today's state of the art electronics and advanced packaging techniques, while at the same time, reducing the risk of breakage due to the fragile state of the thinned workpiece.

The present invention also provides several processes for thinning a semiconductor workpiece. In one aspect, the process includes the steps of placing the semiconductor workpiece into a chuck adapted to cover a peripheral portion of the back side of the workpiece, leaving approximately 95% of the back side surface of the workpiece exposed. The semiconductor workpiece is then thinned via a wet chemical etching process wherein the back side of the workpiece is exposed to an oxidizing agent (e.g., HF, $HNO_3$, $H_3PO_4$, $H_2SO_4$) or alternatively to a caustic solution (e.g., KOH, NaOH, $H_2O_2$). During the wet chemical etching step, the exposed back side of the workpiece is thinned to a thickness less than 50% of the pre-wet chemical etching thickness of the workpiece. As a result, a rim is formed at the periphery of the workpiece, or as it is commonly referred to in the industry, the "exclusion zone." The rim has a thickness approximately equal to the thickness of the workpiece prior to the wet chemical etch step (e.g., in a range of 600 to 725 microns). The remainder of the workpiece (i.e., the thinned main body) has a thickness less than 50% of the rim thickness (e.g., less than 300 microns, preferably less than 125 microns, more preferably less than 100 microns, especially less than 50 microns and even less than 25 microns). This process eliminates the limitations associated with known methods of thinning semiconductor workpieces mentioned above, while increasing overall manufacturing efficiencies.

Any of the described aspects of the invention may be combined and/or repeated one or more times to achieve optimal results. The invention resides as well in sub-combinations of the aspects described. These and other objects, features and advantages of this invention are evident from the following description of preferred embodiments of this invention, with reference to the accompanying drawings.

DETAILED DESCRIPTION

With reference to FIGS. 1A-1E, there is shown a chuck 10 for supporting a semiconductor workpiece 50 during processing in accordance with one embodiment of the present invention. The chuck 10 is comprised of a supporting body 12, a retainer 14 and a sealing members 16, 24. The retainer 14 has two grooves or recesses 18. The sealing members 16, 24 are housed in the annular grooves 18, respectively. The retainer 14 is preferably in the form of a ring and is removeably attached to the supporting body 12. In use, the workpiece 50, which has a device side 51, a bevel (i.e., peripheral edge) 52 and a back side 53, is placed onto a supporting surface 18 of the supporting body 12 of chuck 50, device side 51 down. The retainer 14 is then attached to the outer periphery of the supporting body 12. As shown specifically in FIG. 1C, when the retainer 14 is engaged to the supporting body 12, the retainer 14 wraps around the outer end of the supporting body 12 and covers a peripheral portion of the back side 53 of the workpiece 50, securing the workpiece 50 in the chuck 10.

When engaged, preferably the retainer 14 covers only a small peripheral portion of the back side 53 of the workpiece 50, leaving a majority of the back side 53 of the workpiece 50 exposed. In a preferred embodiment, the back side 53 surface area covered by the retainer 14 extends inwardly from the bevel 52 for about a distance of approximately 1-10 mm, more preferably between about 1-5 mm, and especially between about 2-4 mm. Preferably, at least 95% (or even 97% or 99%) of the back side 53 surface area of the workpiece 50 is left exposed. The exposed portion of the back side 53 of the workpiece 50 is then subjected to a process fluid and thinned to a desired thickness. As a result of covering the peripheral portion of the back side 53 of the workpiece 50, during thinning, process fluid cannot interact with the periphery of the back side 53 of the workpiece 50. Accordingly, the periphery of the back side 53 of the workpiece 50 remains in substantially its same pre-thinning form, configuration and thickness. For purposes of this invention, the semiconductor material remaining at the periphery of the workpiece 50 after thinning is referred to as a rim. It is the rim that imparts strength to the thinned workpiece 50 and permits automated handling equipment to handle the thinned semiconductor workpieces 50 processed according to the present invention.

Figure 1A:
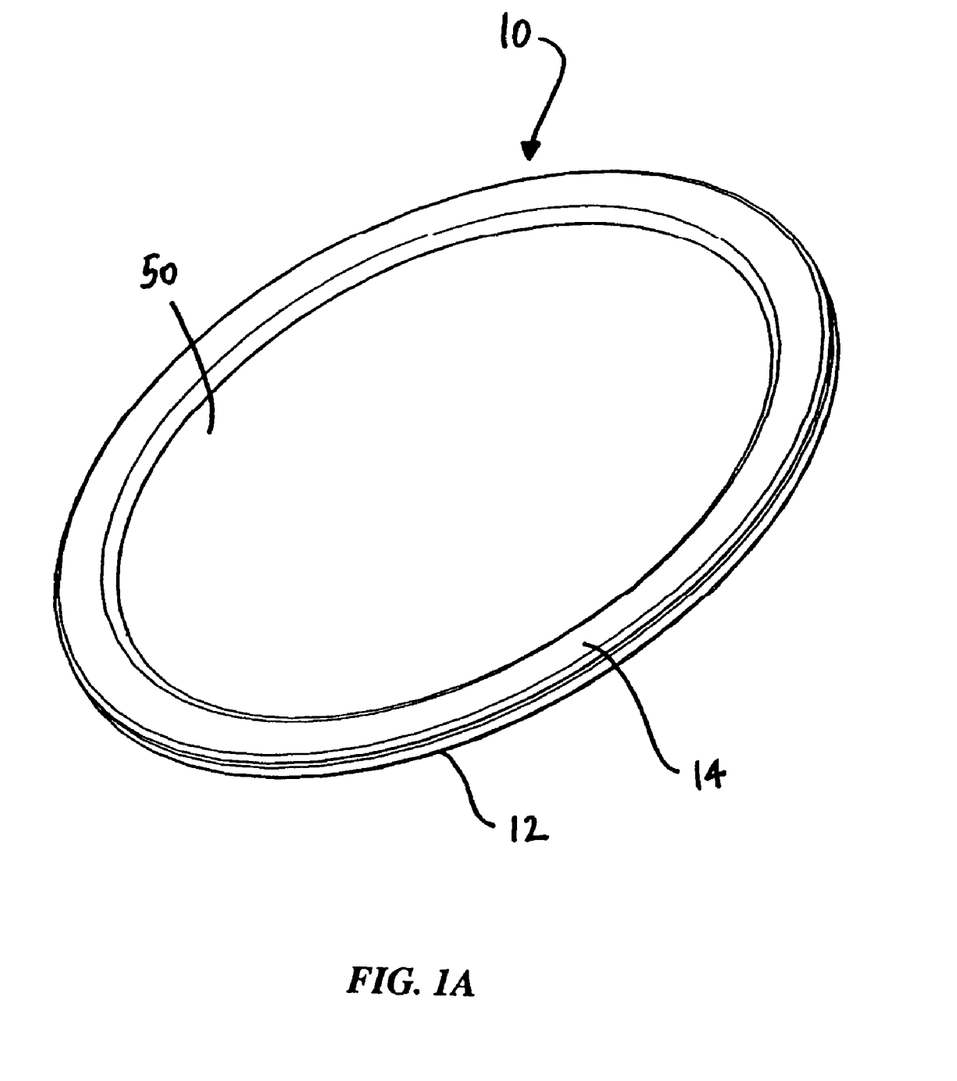
FIG. 1A is a perspective view of a chuck according to the present invention with a semiconductor workpiece secured therein prior to thinning.
Figure 1B:
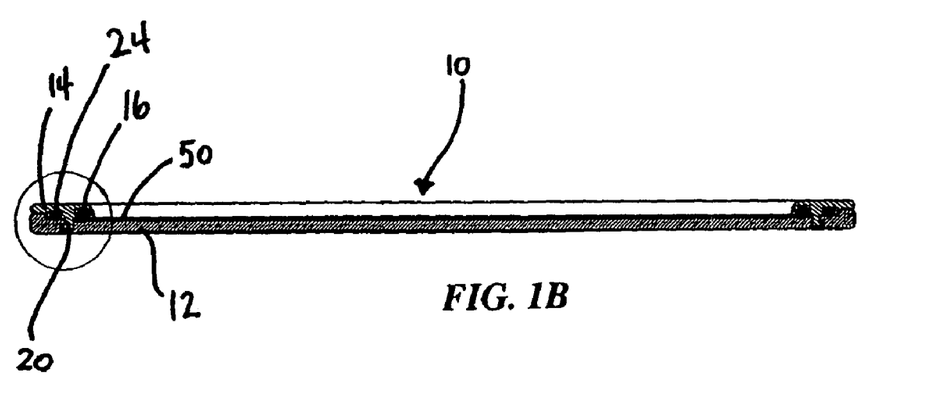
FIG. 1B is a cross-sectional view of the chuck and workpiece shown in FIG. 1A.
Figure 1C:
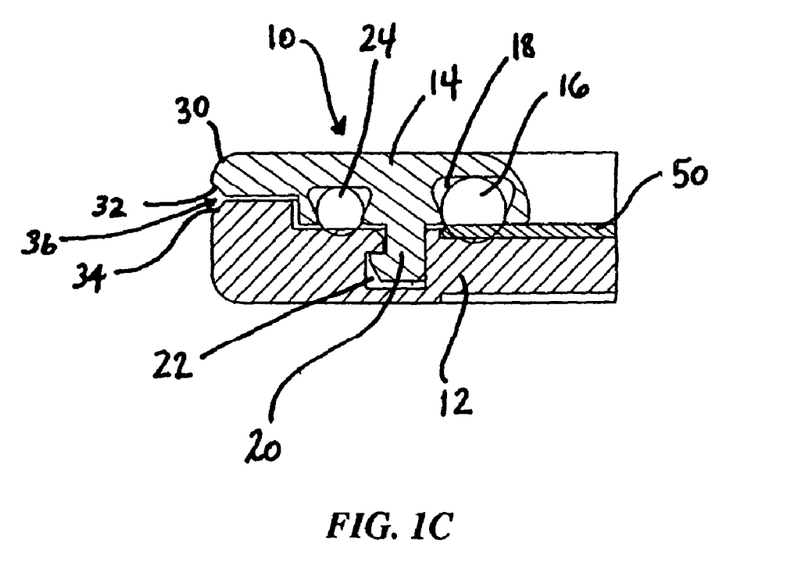
FIG. 1C is a partial enlarged view of the chuck and workpiece shown in FIG. 1B, demonstrating the cooperation between the chuck and the workpiece.
Figure 1D:
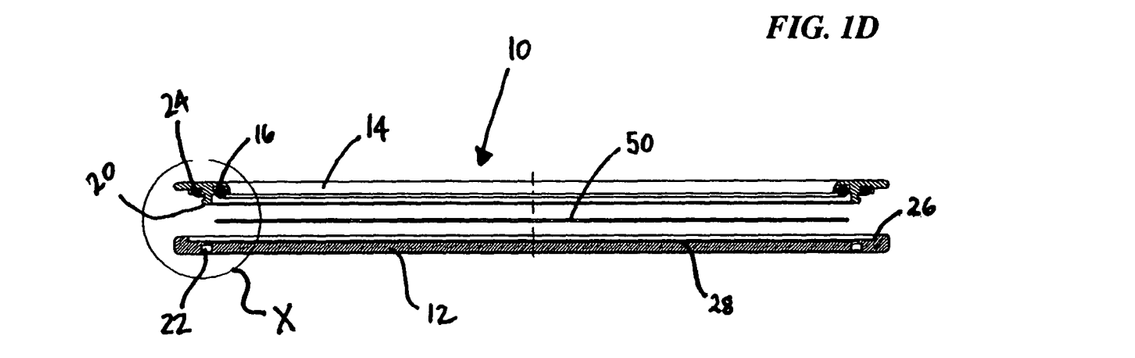
FIG. 1D is an exploded cross-sectional view of the chuck and workpiece shown in FIG. 1A.
Figure 1E:
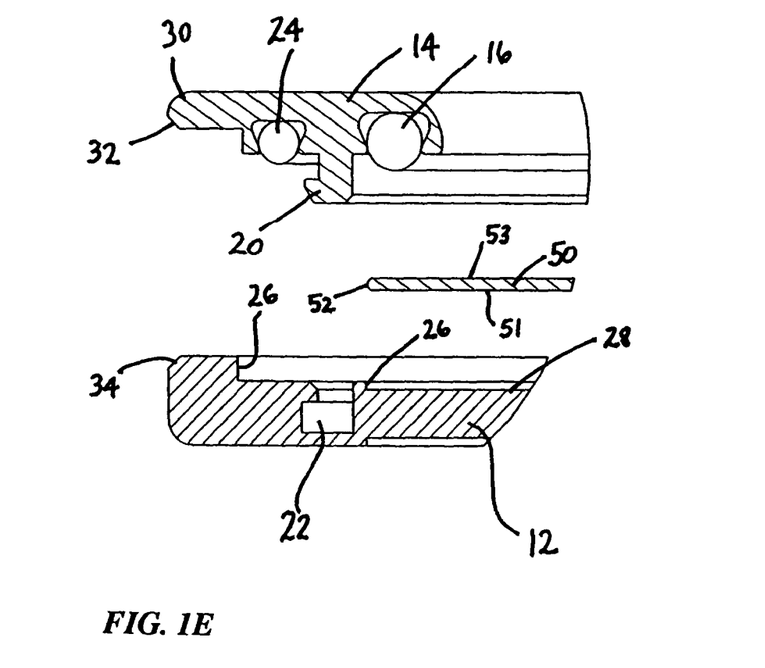
FIG. 1E is a partial enlarged view of the chuck and workpiece section identified as X shown in FIG. 1D.

Turning to FIGS. 1D and 1E, in order to facilitate attachment of the retainer 14 to the supporting body 12, the retainer 14 has an engagement member 20 that cooperates with a recess 22 formed in the supporting body 12. In this manner, a simple mechanical snap connection between the retainer 14 and the supporting body 12 is achieved. Although not shown in FIGS. 1A-1D, the present invention includes a configuration where the engagement member 20 extends from the supporting body 12 and cooperates with a recess 22 formed in the retainer 14 to removeably connect the retainer 14 and supporting body 12. In either configuration, preferably the engagement member 20 and the recess 22 are positioned between the first and second sealing member 16, 24.

With reference to FIG. 1C, the retainer 14 has an outer peripheral end 30 with an angled surface 32. When the retainer 14 is attached to the supporting body 12, the angled surface 32 of the outer peripheral end 30 of the retainer 14 mates with an angled surface 34 at an outer peripheral end of the supporting body 12 to form a notch 36. The notch 36 accepts a tool (not shown) and facilitates removal of the retainer 14 from the supporting body 12.

Turning now to FIG. 1E, the supporting body 12 has a lip or step 26 formed circumferentially therein. The lip 26 acts to register or guide the workpiece 50 as it is loaded into the chuck 10. When properly aligned, the workpiece 50 will rest entirely on the supporting surface 28 of the supporting body 12. While the chuck 10 can be any shape (e.g., square, rectangular, circular, etc), as shown in FIGS. 1A-1E, in a preferred embodiment the chuck is disk-shaped and will have a diameter slightly larger than the diameter of the workpiece 50 to be processed.

Figure 2A:
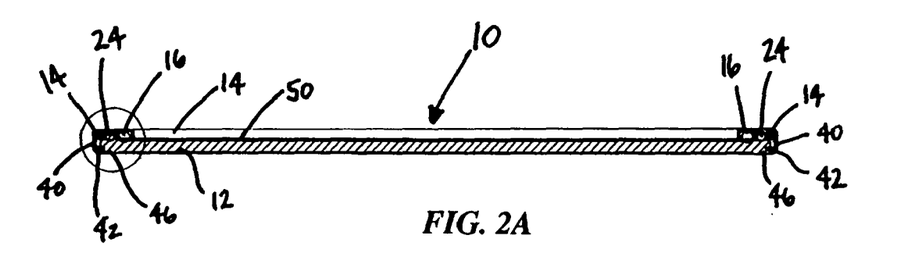
FIG. 2A is a cross-sectional view of another embodiment of a chuck according to the present invention with a workpiece secured therein prior to thinning.
Figure 2B:
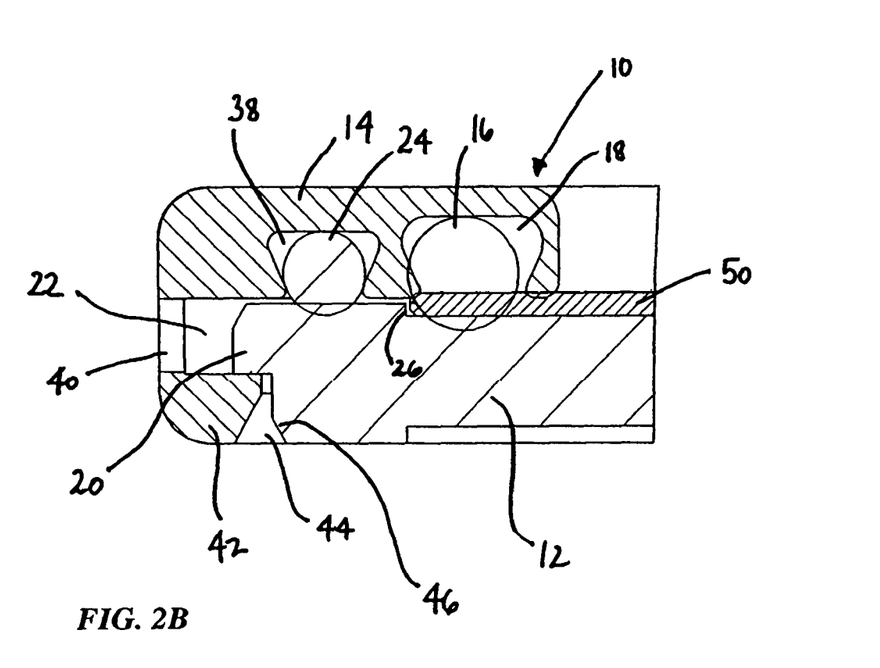
FIG. 2B is a partial enlarged view of the chuck and workpiece shown in FIG. 2A, demonstrating the cooperation between the chuck and the workpiece.

With reference now to FIGS. 2A-2B, there is shown an alternative embodiment of a chuck 10 according to the present invention. Like the chuck 10 shown in FIGS. 1A-1E, the chuck 10 includes a supporting body 12 and a retainer 14. The retainer 14 has first and second sealing members 16, 24 disposed within annular grooves 18, 38. The mechanical attaching mechanism in the embodiment illustrated in FIGS. 2A-2B, however, is slightly different than the mechanism shown in FIGS. 1A-1E. An engagement member 20 extends from the outer periphery of the supporting body 12. The retainer 14, in turn, has a recess 22 that cooperates with the engagement member 20 of the supporting body 12 to provide a simple snap engagement that attaches the retainer 14 to the supporting body 12. An upper portion of the retainer 14, including sealing member 16, covers the exclusion zone of the back side 53 of the workpiece 50 in the engaged position. In this preferred embodiment, the retainer 14 has a plurality of rinse holes 40 for allowing processing fluid to escape from cavities formed in the chuck 10. A lower portion 42 of the retainer 14 which creates the mechanical snap connection with the engaging member 20 forms an annular recess 44 with a mating lower portion 46 of the supporting body 12. A tool (not shown) can be inserted into the annular recess 44 so that the retainer 14 can be simply popped off the chuck 10 supporting body 12 after processing is completed.

In the embodiments having two sealing members 16, 24 (as disclosed in FIGS. 1A-1E and 2A-2B), sealing member 16 creates a flexible interface and seal between the workpiece 50 and the retainer 14 to prevent process fluid from accessing the device side 51 and bevel 52 of the workpiece 50. This flexible interface also relieves some of the stress that is exerted on the workpiece 50 during assembly and disassembly of the chuck 10. Sealing member 24 creates a flexible interface between the retainer 14 and the supporting body 12 and also helps relieve some of the stress that is exerted on the workpiece 50 during assembly and disassembly of the chuck 10.

Figure 3A:
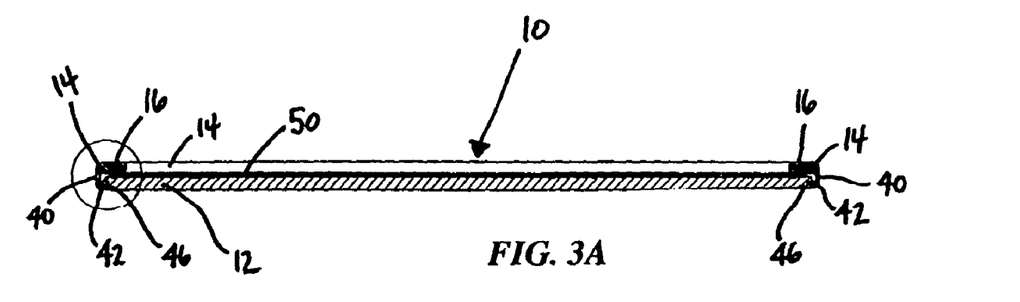
FIG. 3A is a cross-sectional view of yet another embodiment of a chuck according to the present invention with a workpiece secured therein prior to thinning.
Figure 3B:
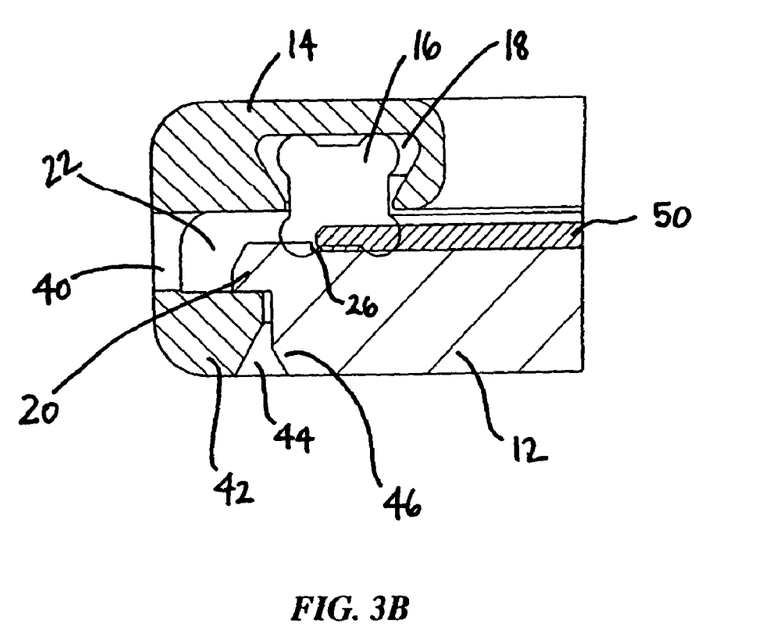
FIG. 3B is a partial enlarged view of the chuck and workpiece shown in FIG. 3A, demonstrating the cooperation between the chuck and the workpiece.

With reference now to FIGS. 3A-3B through 7A-7B, there is shown various chuck 10 designs having only a single sealing member 16. Specifically, FIGS. 3A-3B illustrate a chuck 10 having a retainer 14, supporting body 12 and a engagement mechanism similar to the engagement mechanism shown in FIGS. 2A-2B and described above. The retainer 14, however, has only a single annular groove 18 which is adapted to house sealing member 16. In this embodiment, the annular groove 18 is V-shaped and receives a square-shaped compressible sealing member 16. Preferably the square-shaped sealing member 16 has semi-circular extensions projecting from each corner to ensure an adequate fit in groove 18.

Figure 4A:
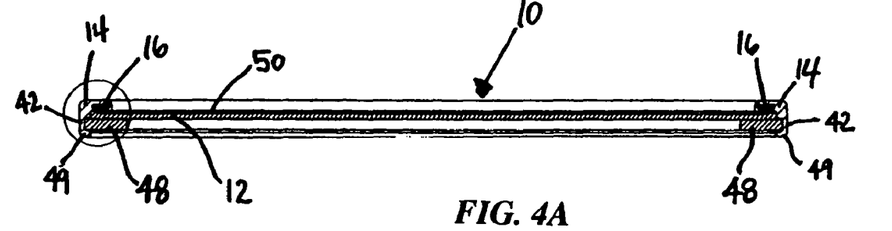
FIG. 4A is a cross-sectional view of another embodiment of a chuck according to the present invention with a workpiece secured therein prior to thinning.
Figure 4B:
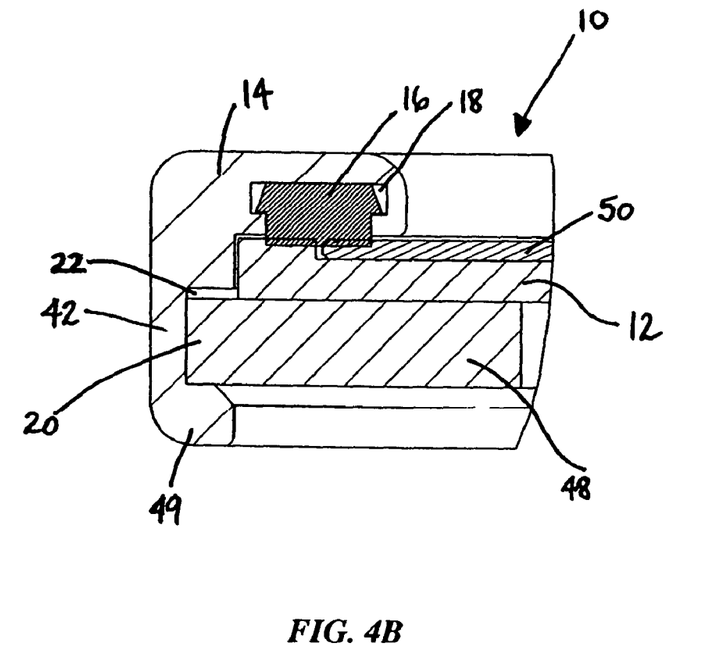
FIG. 4B is a partial enlarged view of the chuck and workpiece shown in FIG. 4B, demonstrating the cooperation between the chuck and the workpiece.
Figure 5A:
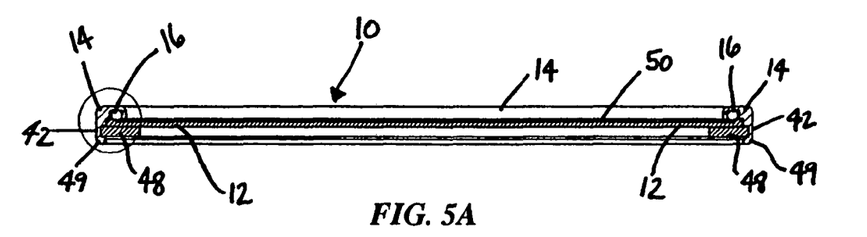
FIG. 5A is a cross-sectional view of another embodiment of a chuck according to the present invention with a workpiece secured therein prior to thinning.
Figure 5B:
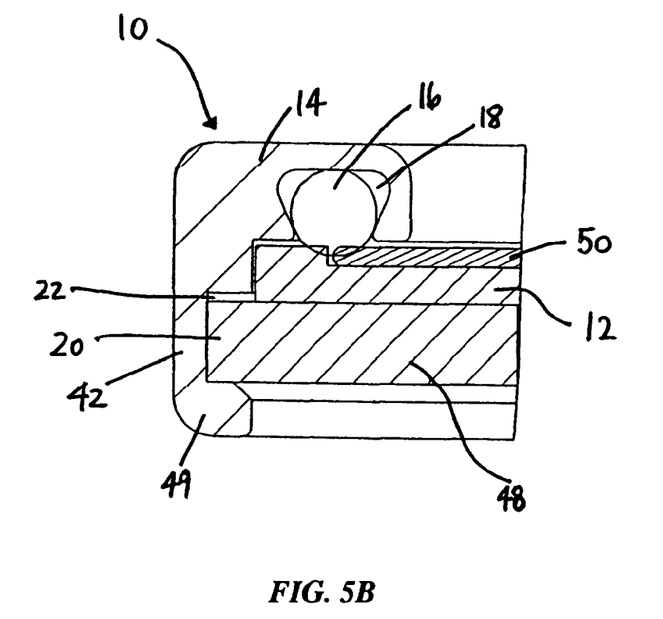
FIG. 5B is a partial enlarged view of the chuck and workpiece shown in FIG. 5A, demonstrating the cooperation between the chuck and the workpiece.

FIGS. 4A-4B and 5A-5B show chucks 10 having an engagement ring 48 attached circumferentially to the bottom outer periphery of the supporting body 12. The engagement ring 48 extends radially outwardly from the supporting body 12, creating a stepped-relationship between the supporting body 12 and engagement ring 48, and forming engagement member 20. The retainer 14 has a lower portion 42 with a U-shaped recess 22 formed therein. The U-shaped recess 22 receives the engagement member 20. The lower portion 42 of the retainer 14 has an extension 49 that wraps around the engagement member 20 to form a mechanical snap connection between the retainer 14 and the engagement ring 46 of the supporting body 12. In FIGS. 4A-4B, the retainer 14 has a two-step annular groove 18 which receives a sealing member 16 having a top part with one width for insertion into one-step of the annular groove 18, and a bottom part with a second width for insertion into the second step of the annular groove 18. In FIGS. 5A-5B, the retainer 14 has a single V-shaped annular groove 18 for housing the sealing member 16, which in this embodiment is a compressible O-ring.

Figure 6A:
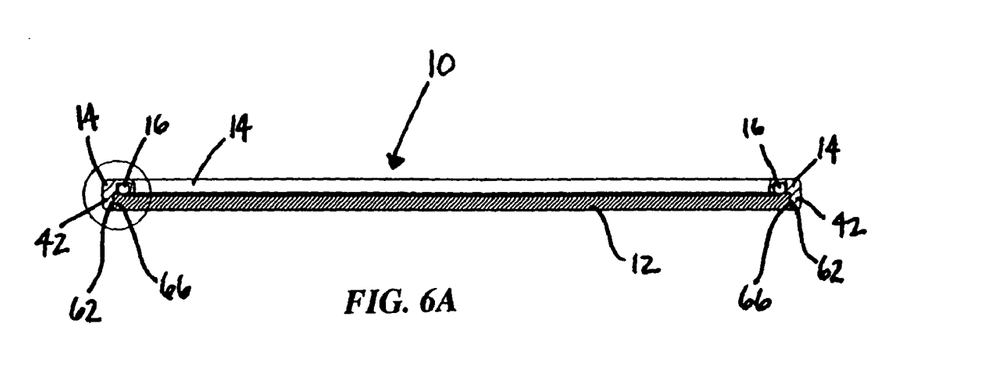
FIG. 6A is a cross-sectional view of yet another embodiment of a chuck according to the present invention with a workpiece secured therein prior to thinning.
Figure 6B:
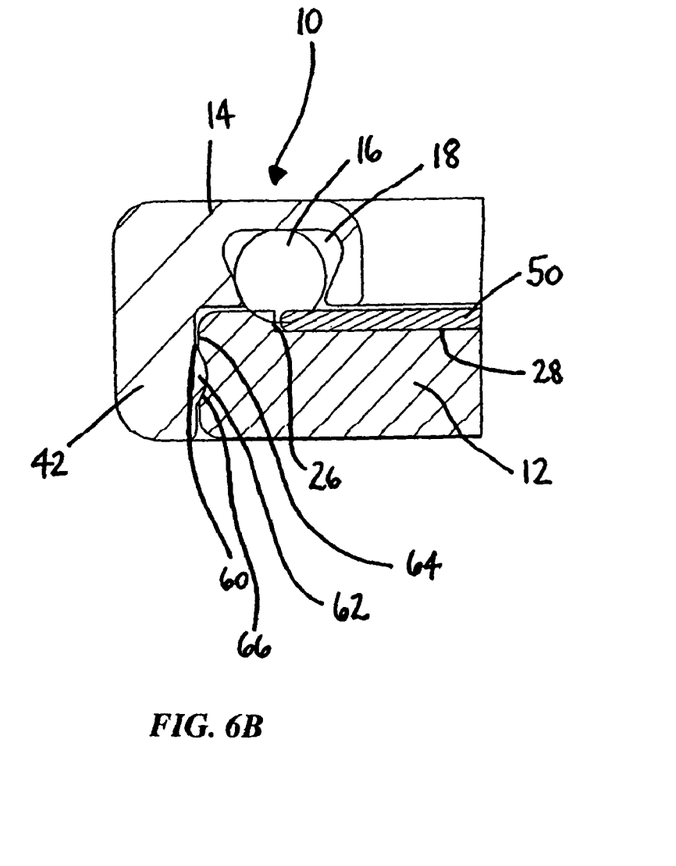
FIG. 6B is a partial enlarged view of the chuck and workpiece shown in FIG. 6A, demonstrating the cooperation between the chuck and the workpiece.

FIGS. 6A-6B illustrate another preferred embodiment of a chuck 10 according to the present invention. In this embodiment, the lower portion 42 of the retainer 14 has an inner side wall 60 with a convex protrusion 62 extending outwardly therefrom. The supporting body 12 has an end wall 64 with a concave recess 66 for accepting the convex protrusion 62 of the inner side wall 60 of the lower portion 42 of the retainer 14. In this manner, the retainer 14 engages the supporting body 12 and secures the workpiece 50 on the supporting surface 28 of the chuck 10.

In the embodiments having only a single sealing member 16 (as disclosed in FIGS. 3A-3B through 6A-6B), sealing member 16 creates a flexible interface between the workpiece 50 and the supporting body 12 to prevent process fluid from interacting with the device side 51 and bevel 52 of the workpiece 50, and to relieve stress exerted on the workpiece during the assembly/disassembly process.

Figure 7A:
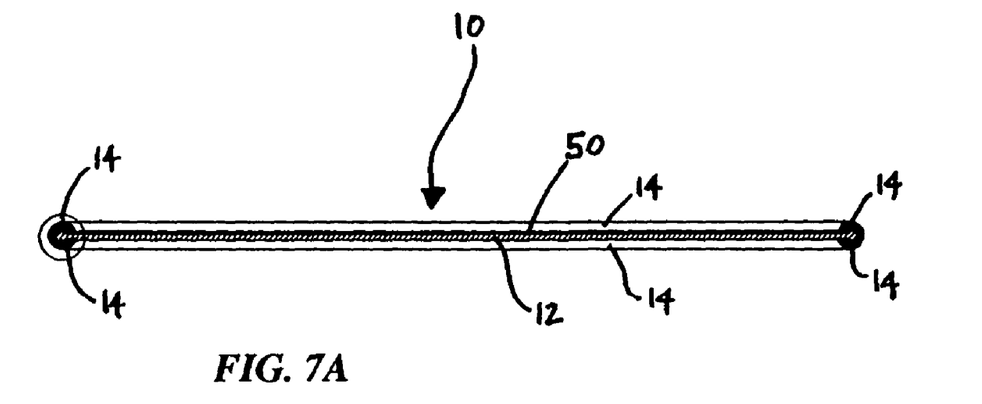
FIG. 7A is a cross-sectional view of an embodiment of a chuck according to the present invention with a workpiece secured therein prior to thinning.
Figure 7B:
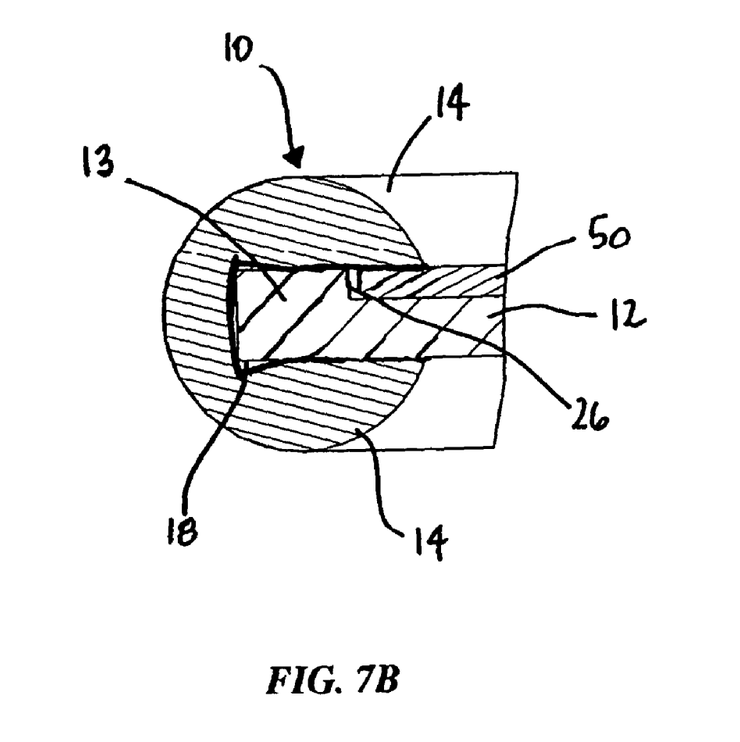
FIG. 7B is a partial enlarged view of the chuck and workpiece shown in FIG. 7A, demonstrating the cooperation between the chuck and the workpiece.

Turning now to FIGS. 7A-7B, there is shown a preferred embodiment of a chuck 10, which combines the retainer 14 and sealing member 16 of the prior embodiments. In this embodiment, retainer 14 is a single-component, compressible annular ring with an annular groove 18 running circumferentially through the middle of the retainer 14. The supporting body 12 has an outer end 13, which is inserted into the annular groove 18 in the retainer 14. The retainer 14 remains engaged to the supporting body 12 as a result of a compression force exerted by the retainer 14 onto the supporting body 12 and the workpiece 50. In the attached position, an outer peripheral portion of the workpiece 50 (e.g., the exclusion zone) is also positioned within the annular groove 18. In this preferred embodiment, retainer 14 creates a seal with the back side 53 of the workpiece 50, preventing process fluid from accessing the bevel 52 and device side 51 of the workpiece 50 during processing.

Suitable materials for use in the chuck 10 embodiments according to the present invention will now be discussed. Generally, the chuck 10 can be made from a number of different polymer materials that are stable and highly chemically resistant. Preferably the supporting body 12 comprises polytetrafluoroethylene and the retainer 14 preferably comprises a fluoropolymer such as polyvinylidene fluoride sold by Atofina Chemicals under the KYNAR tradename. In the embodiment illustrated in FIGS. 7A-7B, the retainer 14 is preferably formed from a material having a Durometer hardness less than that of a fluoropolymer, but greater than the elastomeric materials discussed below with respect to the sealing member. That is, a material compressible enough to form a seal with the workpiece 50, but stiff enough to provide structure to the retainer 14 for receiving the supporting body 12. In any embodiment of the present invention, in order to enhance the attachability of the retainer 14 to the supporting body 12, it is preferred that the supporting body 12 is comprised of a material having a Durometer hardness greater than the Durometer hardness of the material from which the retainer 14 is formed.

As illustrated in FIGS. 1A-1E, 2A-2B, 5A-5B and 6A-6B, the sealing members 16, 24 are preferably shaped like an "O-ring," but it is contemplated that other shapes can be used as well (e.g., as shown in FIGS. 3A-3B and 4A-4B). The sealing members 16, 24 are preferably formed from a compressible material having a Durometer hardness equal to or greater than 50. Specific examples of suitable elastomeric materials include: a perfluoroelastomer sold by DuPont under the tradename Kalrez; a perfluoroelastomer sold by Greene, Tweed & Co. under the tradename Chemraz; fluoruelastomers sold by DuPont under the tradename Viton; and hydrocarbon elastomers sold under the tradename EPDM.

Figure 8:
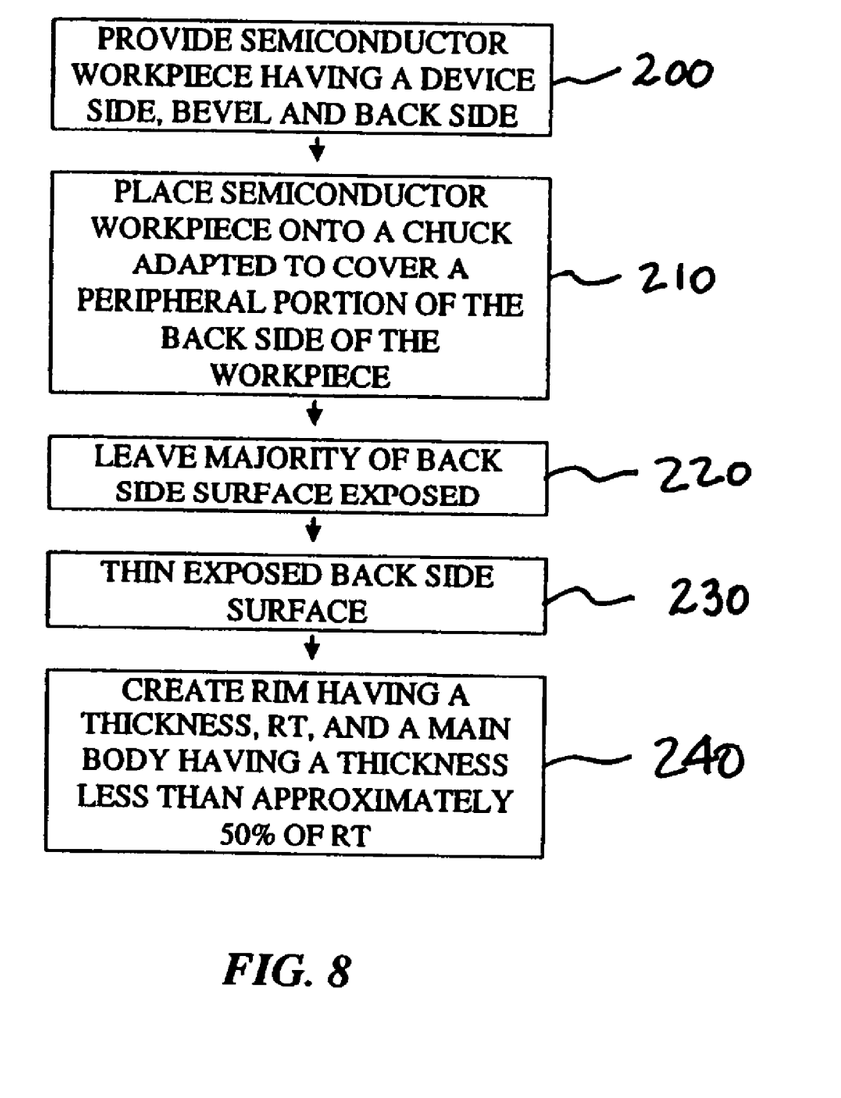
FIGS. 8 and 9 are flow diagrams depicting aspects of process flows in accordance with the present invention.

Turning now to the workpiece thinning processes according to the present invention, FIG. 8 illustrates one embodiment of a process that may be implemented when the chuck 10 and workpiece 50, described above, are used to thin the back side 53 of the workpiece 50. At step 200, a workpiece 50 is provided having a device side 51, a bevel 52 and a back side 53. The back side 53 of the workpiece 50 will have a given surface area depending on its dimensions. Also, the workpiece 50 has a given thickness.

At step 210, the workpiece 50 is placed onto the supporting surface 28 of chuck 10 with the device side 51 immediately adjacent to the supporting body 12 of the chuck 10. The retainer 14 is attached to the supporting body 12 so that a peripheral portion (e.g., the exclusion zone of the workpiece 50) of the back side 53 of the workpiece 50 is covered. In step 210, the workpiece 50 is secured to the chuck 10. As a result of the chuck 10 configuration, upon attaching the retainer 14 to the supporting body 12, in step 220 a majority (and preferably at least 95%, more preferably at least 97% and especially at least 99%) of the back side 53 surface area is exposed, while a small peripheral portion of the back side 53 of the workpiece 50 is covered.

The workpiece 50 is then thinned to a desired thickness at step 230 by applying a process fluid to the exposed back side 53 of the workpiece 50. Due to the overlapping configuration of the retainer 14, by thinning the exposed back side 53 of the workpiece, at step 240, a rim and a main body is formed in the workpiece 50. The rim is formed at the outer periphery of the workpiece 50 and has a thickness, RT and the main body of the workpiece 50 has a thickness, MBT. In the preferred embodiment of FIG. 8, the MBT is less than approximately 50% of the RT. A desired MBT is preferably less than approximately 40% of the RT; more preferably less than approximately 30% of the RT; especially less than approximately 20% of the RT; and even less than approximately 10% of the RT. It should be understood that after thinning the workpiece 50, the RT should be substantially the same as the workpiece 50 thickness prior to the thinning process. Thus, for conventional 200 mm and 300 mm workpieces, the RT after thinning will be about 725 microns. And the RT of a conventional 150 mm workpiece after thinning will be about 650 microns.

It is within the scope of the present invention, however, to process a workpiece 50, which has previously been thinned by some other method, e.g., mechanical grinding. Thus, a workpiece 50 having a thickness of anywhere from 150-725 microns can be thinned according to the present invention to create a workpiece 50 with a rim having a RT in a range of substantially the same thickness as the workpiece 50 (i.e., about 150-725 microns, even about 600-725, or even about 300-725) and a main body having a MBT in a range of about 25-300 microns, preferably in a range of about 100-125 microns, more preferably in a range of about 50-100 microns, especially in a range of about 25-50 microns.

Figure 9:
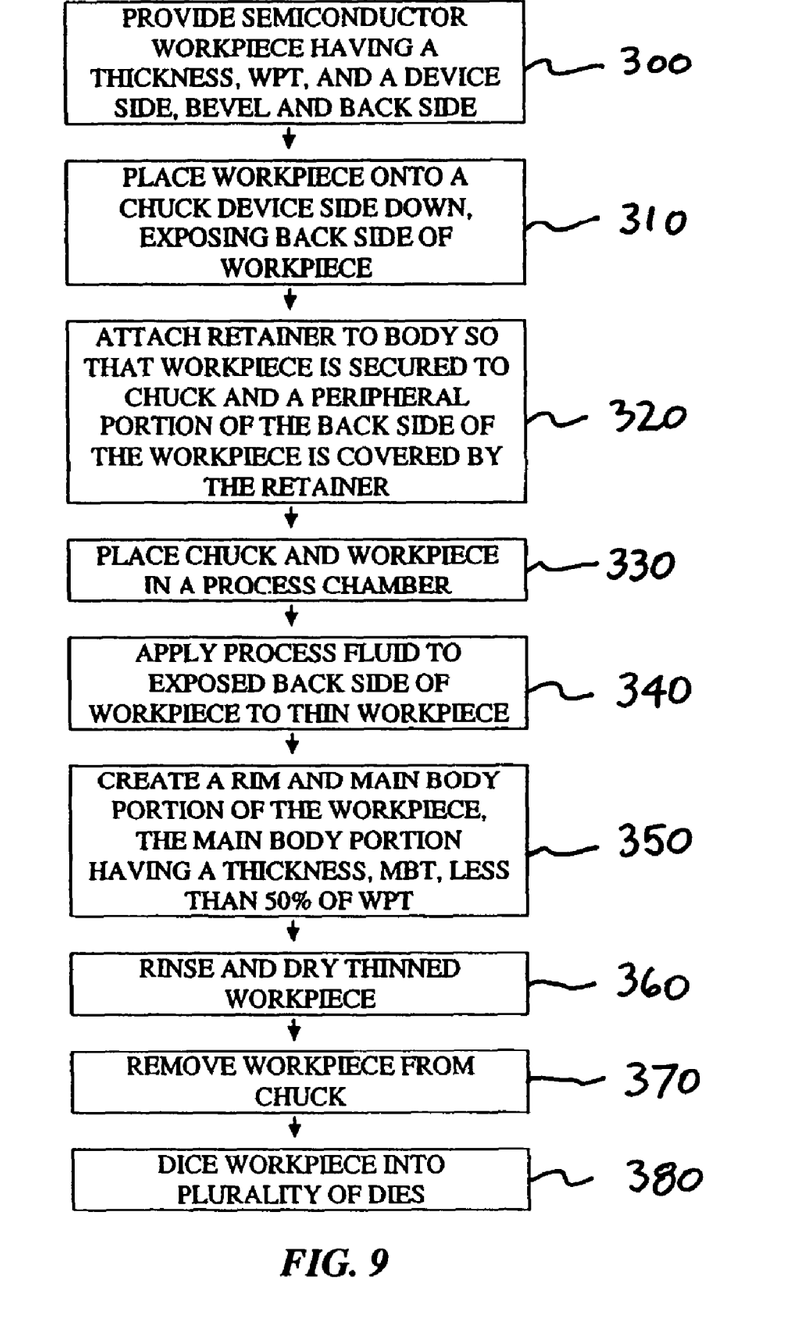

Turning now to FIG. 9, there is shown another embodiment of a process that may be implemented when the chuck 10, described above, is used to thin a workpiece 50. At step 300, a workpiece 50 having a thickness, WPT, is provided. The workpiece 50 has a device side 51, a bevel 52 and a back side 53. The workpiece 50 is placed onto the chuck 10 with the device side 51 immediately adjacent to the supporting body 12 of the chuck 10 at step 310. At step 320, the retainer 14 is attached to the supporting body 12 so that a peripheral portion of the back side 53 of the workpiece 50 is covered. In this step, the workpiece 50 is secured to the chuck 10. As a result of the chuck 10 configuration, when the retainer 14 is attached to the supporting body 12, with the exception of the covered exclusion zone, substantially all of the back side 53 of the workpiece 50 is exposed.

Still referring to FIG. 9, at step 330 the chuck 10 and workpiece 50 are placed into a process chamber. The process chamber may be manual or automated and is preferably within a spray acid tool platform like those available from Semitool, Inc., of Kalispell, Mont. Once inside the process chamber, a process fluid is applied to the exposed back side 53 of the workpiece 50 at step 340. The thinning process of step 340 preferably comprises a conventional wet chemical etch process or a polishing process. In either process, the process fluid preferably consists of one, or a combination of: deionized water, hydrogen peroxide, ozone, potassium hydroxide, sodium hydroxide, hydrofluoric acid, nitric acid, sulfuric acid, acidic acid and phosphoric acid. A number of other acidic and basic solutions may also be used, depending on the particular surface to be treated and the material that is to be removed.

The process fluid can be applied to the workpiece 50 in any conventional manner. In one preferred embodiment, however, the process fluid is sprayed through a nozzle or a plurality of nozzles onto the back side 53 of the workpiece 50. In another preferred embodiment, the chuck 10 and workpiece 50 are immersed into a volume of process fluid, or sequentially into a plurality of volumes of the same process fluid (at different concentrations or temperatures) or different process fluids.

Depending on the composition of the material to be removed and the amount of material to be removed (i.e., the desired end thickness of the workpiece), the process fluid will have a desired concentration, a temperature and a flow rate. By monitoring and maintaining these process fluid variables, the process fluid can be applied to the exposed back side 53 of the workpiece 50 at a first etch rate, and then subsequently at a second etch rate. Preferably, the first etch rate is greater than the second etch rate. That is, semiconductor material is etched away quickly at first, and then more slowly as the thickness of the workpiece 50 approaches the desired thickness.

Referring to step 350 of FIG. 9, the thinning process forms a rim 70 and a main body 72 in the workpiece 50. The thinning process is carried out until the main body 72 reaches a desired thickness, MBT. Preferably, the MBT is less than 50% of the WPT, more preferably less than 40% of the WPT, even more preferred less than 30% of the WPT, especially less than 20% of the WPT and especially preferred less than 10% of the WPT. It is preferable to measure the thickness of the main body 72 of the semiconductor workpiece 50 throughout the thinning process. This can be accomplished by employing conventional infrared monitoring technology in the process chamber, or by any other known measuring technique such as a capacitive measurement technique. If need be, the process fluid variables described above can be adjusted based on the continued monitoring of the workpiece thickness.

At step 360, the thinned workpiece 50 is rinsed and dried. For example, the workpiece may be sprayed with a flow of deionized water, nitrogen or phosphoric acid during the rinsing step and may then be subject to any one or more known drying techniques thereafter. Finally, the workpiece 50 is then removed from the chuck (step 370) and the thinned workpiece 50 is diced into a plurality of dies (step 380).

Thinning of semiconductor workpieces 50 can be carried out on a single workpiece 50, or on a plurality of workpieces 50 simultaneously, according to the present invention. When thinning a plurality of workpieces 50, it is desirable to place each workpiece 50 into a corresponding chuck 10 and then place the plurality of chucks 10 and workpieces 50 into a carrier such as the carriers disclosed in co-pending U.S. patent applications Ser. Nos. 10/200,074 and 10/200,075, the disclosures of which are incorporated herein by reference. Once the plurality of workpieces 50 (and associated chucks 10) are placed in the carrier, the carrier is loaded into a process vessel and a process fluid is applied to the exposed back sides 53 of the plurality of workpieces 50. In order to ensure an adequate application of the process fluid to the workpieces 50, it is preferable to rotate the chucks 10 or the carrier, or both, within the process vessel during processing. The process vessel can be a stand alone tool, or one of a plurality of workstations making up a larger, workpiece 50 processing system.

Figure 10:
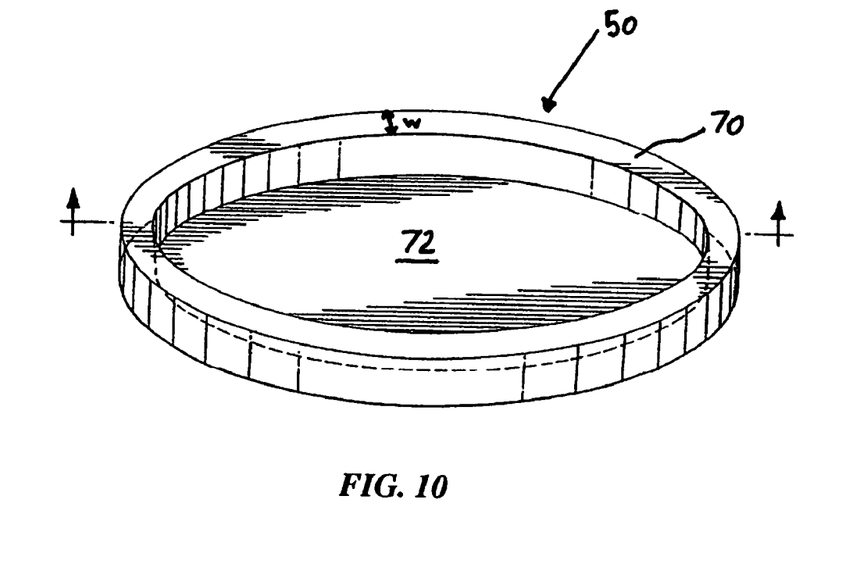
FIG. 10 is a perspective view of a semiconductor workpiece thinned according to a process of the present invention.
Figure 11:
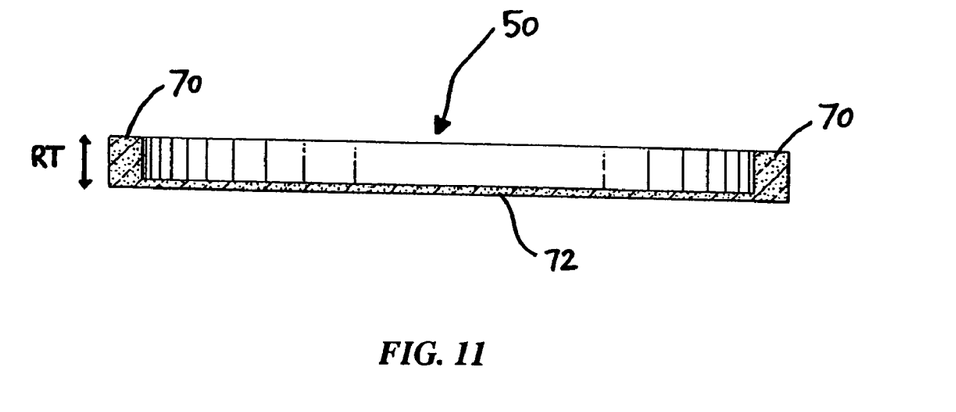
FIG. 11 is a cross-sectional view of the thinned semiconductor workpiece shown in FIG. 10.

With reference now to FIGS. 10-11, the resulting thinned semiconductor workpiece 50 processed according to the process of the present invention will be described. As described above, the thinned workpiece 50 is comprised of a rim 70 and a main body 72. The rim 70 is formed at the periphery of the workpiece 50 and is integral with the main body 72. Generally, when processing standard semiconductor workpieces 50, the processed workpiece 50 will have a main body 72 with a thickness less than 125 microns and a rim 70 with a thickness in a range of approximately 600 to 725 microns. In a preferred embodiment, however, the main body 72 thickness will be less than 100 microns, mre preferably less than 50 microns, and especially less than 25 microns. As mentioned, the rim 70 is formed at the exclusion zone of the workpiece 50 and will have a width (shown as w in FIG. 10) in a range of 1-10 mm, preferably a range of 1-5 mm and especially in a range of 1-2 mm. The main body 72 and rim 70 are formed from substantially the same material as the pre-thinned workpiece 50. Most preferably the main body 72 and rim 70 are comprised of silicon.

As also mentioned above, it is contemplated that workpieces 50 that have previously been thinned by another process can be thinned according to the present invention. In these instances, the initial thickness of a workpiece 50 to be thinned according to the present invention may be 200 microns or less. In such case, a workpiece 50 thinned according to the present invention will have a main body 72 thickness less than about 50% of the rim 70 thickness, preferably less than about 40% of the rim 70 thickness, more preferably less than 30% of the rim 70 thickness, preferentially less than 20% of the rim 70 thickness, even less than 10% of the rim 70 thickness and especially less than 5% of the rim 70 thickness. It is also contemplated that the present invention can be used to thin workpieces 50 of varying sizes. Accordingly, the rim 70 will preferably comprise less than approximately 5% of the back side 53 surface area (BSSA) of the workpiece 50, more preferably less than 3% of the BSSA, and even less than 1% of the BSSA.

Numerous modifications may be made to the foregoing invention without departing from the basic teachings thereof. Although the present invention has been described in substantial detail with reference to one or more specific embodiments, those of skill in the art will recognize that changes may be made thereto without departing from the scope and spirit of the invention.

What is claimed is:

1. A semiconductor workpiece produced according to a process of thinning a semiconductor workpiece having a device side and a back side, the back side having a back side surface area, BSSA, the process comprising:
    placing the semiconductor workpiece into a chuck, the device side of the workpiece being free from a protective tape or polymer;
    covering a peripheral portion of the back side of the workpiece leaving at least 95% of the BSSA is exposed; and
    thinning the exposed back side of the workpiece to create a rim having a thickness, RT, and a main body having a thickness less than approximately 50% of the RT the rim extending outwardly from the back side of the workpiece but not from the device side of the workpiece.

2. The semiconductor workpiece of claim 1, wherein the main body has a thickness less than approximately 20% of the RT.

3. The semiconductor workpiece of claim 1, wherein the main body has a thickness less than approximately 10% of the RT.

4. The semiconductor workpiece of claim 1, wherein RT is in a range of 200 to 725 microns.

5. The semiconductor workpiece of claim 4, wherein the main body portion has a thickness less than 100 microns.

6. The semiconductor workpiece of claim 5, wherein the main body has a thickness in a range of about 50 to less than 100 microns.

7. A semiconductor workpiece produced according to a process of thinning a semiconductor workpiece, the process comprising:
    providing the semiconductor workpiece with a back side and a device side both being free from a protective film or tape, the workpiece having a workpiece thickness, WPT;
    placing the semiconductor workpiece onto a chuck body so that the back side of the workpiece is exposed;
    attaching a retainer to the chuck body so that the workpiece is secured to the chuck body and a portion of the back side of the workpiece is covered by the retainer a portion of the back side of the workpiece is exposed; and
    thinning the exposed portion of the back side of the workpiece to create a rim and a main body portion, the main body portion having a thickness, MBT, less than 50% of the WPT and the rim extending outwardly from the back side of the workpiece but not from the device said of the workpiece.

8. The semiconductor workpiece of claim 7, wherein the step of thinning the exposed portion of the back side of the workpiece comprises a thinning process selected from the group comprising grinding, etching, polishing and any combination thereof.

9. The semiconductor workpiece of claim 7, wherein thinning the exposed portion of the back side of the workpiece comprises chemical etching.

10. The semiconductor workpiece of claim 9, wherein the chemical etching comprises applying a process fluid to the exposed portion of the back side of the workpiece, the process fluid being selected from the group comprising hydrogen peroxide, ozone, potassium hydroxide, sodium hydroxide, hydrofluoric acid, nitric acid, sulfuric acid, acidic acid and phosphoric acid.

11. A semiconductor workpiece produced according to a process of:
    placing the semiconductor workpiece in a chuck without applying a protective layer to the workpiece, the chuck being adapted to surround a peripheral portion of a back side of the workpiece and a device side of the workpiece so that a main body portion of the back side of the workpiece is exposed;
    placing the chuck and workpiece into a process vessel; and
    applying a process fluid to the exposed main body portion of the back side of the workpiece to thin the main body portion to create a rim that extends outwardly from the peripheral portion of the back side of the workpiece.

12. The semiconductor workpiece of claim 11, wherein the main body portion of the workpiece and the rim each have a respective thickness, the thickness of the main body portion being less than 50% of the rim thickness.

13. The semiconductor workpiece of claim 12, wherein the thickness of the main body portion is less than 30% of the rim thickness.

14. The semiconductor workpiece of claim 13, wherein the thickness of the main body portion is less than 10% of the rim thickness.

15. A semiconductor workpiece produced according to a process of thinning a semiconductor workpiece, the process comprising
    placing the semiconductor workpiece onto a chuck, the semiconductor workpiece having a device side and a back side free from a protective film, layer and tape;
    attaching a retainer to the chuck to secure the work piece to the chuck and surround a peripheral portion of the back side of the workpiece so that a main body portion of the back side of the workpiece is exposed;
    placing the chuck in a carrier;
    loading the carrier into a process vessel;
    rotating the chuck in the process vessel; and
    applying a process fluid to the exposed main body portion of the back side of the workpiece as the chuck rotates in the process vessel to thin the main body portion of the back side of the workpiece to a thickness and create a rim having a thickness greater than the main body portion thickness.

16. The semiconductor workpiece of claim 15, wherein the main body thickness is approximately 50% less than the rim thickness.

17. The semiconductor workpiece of claim 16, wherein the main body thickness is in a range of 25-125 microns and the rim thickness is in a range of 200-735 microns.

18. A semiconductor workpiece produced according to a process of thinning the semiconductor workpiece, the process comprising the steps of:
    providing a semiconductor workpiece having a back side and a device side, the device side and the back side being free from a protective film, tape and layer;
    placing the semiconductor workpiece in a chuck configured to protect the device side of the semiconductor workpiece; and
    thinning the back side of the semiconductor workpiece to create a rim having a thickness, RT, and a main body having a thickness, MBT, wherein MBT is less than approximately 50% of the RT and the rim extends outwardly from the back side of the semiconductor workpiece but not from the device side of the semiconductor workpiece.

19. The semiconductor workpiece of claim 18, wherein the step of thinning the backside of the workpiece comprises chemical etching.

20. A semiconductor workpiece produced according to a process of thinning the semiconductor workpiece, the process comprising the steps of:

provinding a semiconductor workpiece having a back side and a device side, the semiconductor workpiece having a workpiece thickness WPT;

protecting the device side of the semiconductor workpiece without applying a protective layer to the device side of the semiconductor workpiece;

thinning the back side of the semiconductor workpiece to create a rim having a rim thickness, RT, and a main body having a main body thickness, MBT, wherein RT is approximately equal to WPT, and MBT is less than approximately 20% of RT;

removing the protection from the device side of the semiconductor workpiece; and dicing the workpiece into a plurality of dies.

21. The semiconductor workpiece of claim 20, wherein the rim is removed from the workpiece before the step of dicing the workpiece into a plurality of dies.

* * * * *